United States Patent
Peterson et al.

(10) Patent No.: US 11,416,225 B1
(45) Date of Patent: Aug. 16, 2022

(54) COMPLEXITY ANALYSIS OF FUNCTION MODELS

(71) Applicant: Shainin II LLC, Northville, MI (US)

(72) Inventors: Matthew Peterson, Easley, SC (US); Craig Hysong, Saline, MI (US); Volodymyr Korotun, Kyiv (UA)

(73) Assignee: Shainin II LLC, Northville, MI (US)

( * ) Notice: Subject to any disclaimer, the term of this patent is extended or adjusted under 35 U.S.C. 154(b) by 0 days.

(21) Appl. No.: 17/448,319

(22) Filed: Sep. 21, 2021

(51) Int. Cl.
*G06F 8/38* (2018.01)
*G06F 8/35* (2018.01)
*G06F 11/07* (2006.01)
*G06F 3/04812* (2022.01)
*G06F 8/20* (2018.01)

(52) U.S. Cl.
CPC ............ *G06F 8/38* (2013.01); *G06F 3/04812* (2013.01); *G06F 8/20* (2013.01); *G06F 8/35* (2013.01); *G06F 11/0706* (2013.01)

(58) Field of Classification Search
None
See application file for complete search history.

(56) References Cited

U.S. PATENT DOCUMENTS

| | | | |
|---|---|---|---|
| 8,742,959 B1* | 6/2014 | Efros | H03M 7/3059 341/51 |
| 10,705,605 B2* | 7/2020 | Ikuta | G02B 27/0172 |
| 2014/0002342 A1* | 1/2014 | Fedorovskaya | G06Q 10/10 345/156 |
| 2021/0165969 A1* | 6/2021 | Galitsky | G06F 40/30 |

\* cited by examiner

*Primary Examiner* — Toan H Vu
(74) *Attorney, Agent, or Firm* — Stoel Rives LLP

(57) ABSTRACT

A modeling system may generate a function model and a corresponding functional complexity score (FCS) for display on a graphical user interface (GUI). The FCS may be calculated by looping through each level of the function model and determining a score based on both hierarchical relationships and functional relationships within the function model at each level. The modeling system may constantly monitor for additional inputs representative of an additional function or changes to current functions and automatically update the FCS displayed on the GUI based on the additional inputs.

20 Claims, 10 Drawing Sheets

COMPLEXITY ANALYSIS OF FUNCTION MODELS

TECHNICAL FIELD

The present application is directed to generating a functional model and analyzing complexity of the functional model.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
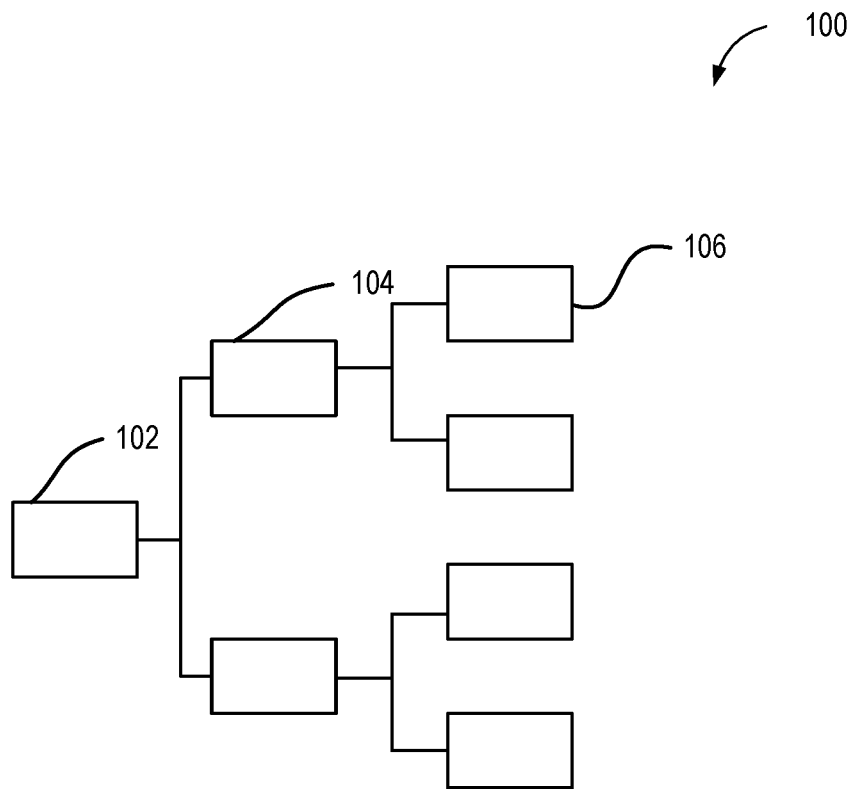
FIG. 1 illustrates a simplified function model in accordance with one embodiment.

Research and development for new systems, devices, or methods can be extremely expensive and time consuming. One cause of high cost and lengthened research and development periods is the perpetuation of conflicts, redundancies, or other problems in a design. For example, design redundancies may be introduced in the early stages of designing a system, product, or process but may not be recognized until prototypes have been built or until significant time and effort has been put into developing or testing the design.

As an engineering design project progresses, the ability to make changes to the design decreases and the costs associated with making those changes increase. Thus, it is important to identify potential problems with conceptual designs early in the design project process.

Function models provide a way to visual conceptualize product designs or process flows. A function model is a visual representation of the decomposition of a function into its sub-functions, often organized as a function tree. A function model may be either a product function model or a process function model. A functional interaction is any relationship between two functions within a function model that is not one of the hierarchical relationships of the function model. These functions may be classified as surface, framework, or foundational functions depending upon their location within the function model.

Functional interactions can be used to highlight unintended interrelationships between individual functions within a function model in the forms of conflicts and redundancies. A conflict or redundancy associated with a functional interaction can have varying severity with regards to its effect on the viability of a given function model.

A functional conflict or design conflict is occurs when the execution of one of the interacting functions inhibits the execution of the other interacting function. Functional conflicts are two functions which are at odds with one another. One example of a design conflict in automotive electronic power steering systems is the conflict between the desire for the steering to feel stiff and the minimization of road noise. If stiff steering is achieved the system transmits more undesired road noise. To minimize road noise, the steering must be loose. Thus, "stiff feeling steering" is in conflict with "minimizing road noise."

A functional redundancy or design redundancy occurs when the two interacting functions are synonymous with one another, either because they are exact duplicates or because the meaning of the two interacting functions are the same.

Complexity of a function model may provide an indication of costs and efficiencies of resulting product designs and process flows. Thus, evaluating a complexity of the function model may provide an opportunity to optimize the resulting product designs and process flows. Existing methods, however, do not consider functional interactions when quantifying the overall complexity of a given function model. Previous attempts may evaluate the complexity of a function model, but only with regards to the hierarchical relationships between the individual functions within the model, with no consideration for functional interactions.

Embodiments herein describe systems, methods, and apparatuses for calculating a functional complexity score (FCS) for a function model. The FCS may provide a metric for evaluating complexity of a function model considering the hierarchical structure of the function model as well as any functional interactions which exist within the model. For example, some embodiments herein define how the FCS may be calculated based on which types of functional interactions reside within the function model in question. Some embodiments describe a way to calculate the FCS and integrate the calculation into a function modeling system.

Additional details and examples are provided with reference to the figures below. The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments.

FIG. 1 illustrates a simplified function model 100. The function model comprises a set of functions (e.g., function 102, function 104, and function 106) represented by model element blocks. The functional model has a hierarchical structure where some functions lead to other functions. Different functions may be at different hierarchal levels. The levels correspond to the aligned columns of functions in the left to right direction. For example, function 102 is in a first level, function 104 is in a second level and function 106 is in a third level. As described with reference to FIG. 2 one or more of the functions may be a critical function or a redundant function.

Figure 2:
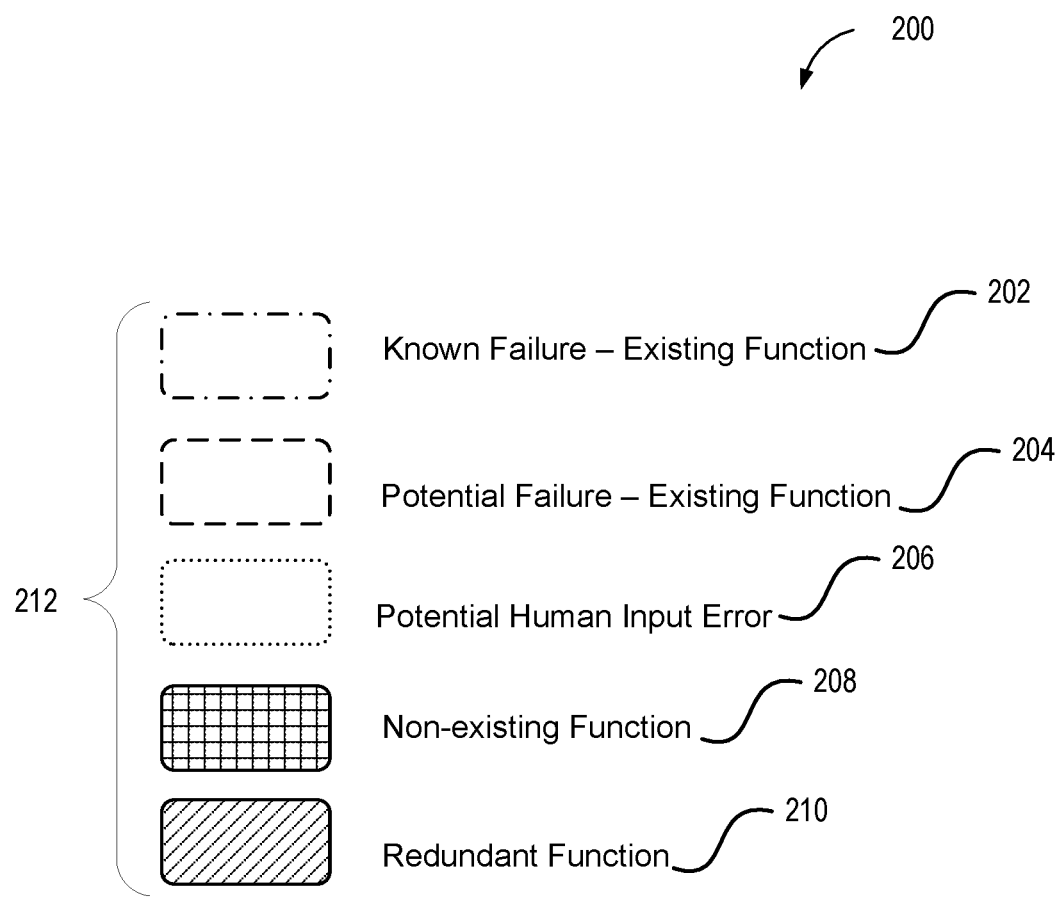
FIG. 2 illustrates how critical or redundant functions are designated visually in a function model.

FIG. 2 illustrates various types of failed or redundant function designations 200 that embodiments herein may consider when calculating an FCS for a function model. The function designations 200 may be associated with functions of a function model to allow a modeling system to consider the failure or redundancy as well as the hierarchical structure to determine the FCS. As shown, the function designations 200 may include a known failure 202, a potential failure 204, a potential human input error 206, a non-existing function 208, and a redundant function 210. Each of the function designations 200 may be represented with unique model element blocks 212 when displayed in a function model (e.g., simplified function model 100 of FIG. 1).

The functions may be considered a critical function when it is classified as a failed or a potentially failed function. A critical function may include a function with a known failure 202, a function with a potential failure 204, a function with a potential human input error 206, and a non-existing function 208. In some embodiments, a redundant function 210 may also be classified as a critical function. In some embodiments, there may be fewer function designations 200.

The function designations 200 may be associated with a function in a variety of ways. In some embodiments, a modeling system may automatically identify the function designations 200. For example, a modeling system may receive a function model and process the contents of the functions to determine redundant functions 210 or critical functions. In some embodiments, the user may classify the functions as having one of the function designations 200.

In some embodiments, an FCS may be calculated using Equation 1.

$$FCS = \sum_{i=1}^{n}(F_i + C_i + R_i) \times i \qquad \text{Equation 1}$$

where:
  i represents the level of decomposition (e.g., hierarchal level) of the function model,
  $F_i$ represents the number of functions that exist in the ith level of the model,
  $C_i$ represents the number of critical functions that exist in the ith level of the model, and
  $R_i$ represents the number of redundant functions in the ith level of the model The FCS equation uses the number of functions and sub-functions, the hierarchal placement within a functional tree, and the function type to determine a complexity score. The inclusion of the $C_i$ term in the calculation of the FCS allows a modeling system to account for critical functions, and the $R_i$ term allows a modeling system to account for redundant functions. By accounting for critical functions and redundant functions, the FCS considers not only the form of the function model (e.g., the number of functions in each level) but also the content of the functions. Note that as critical functions are addressed (i.e., $C_i$ approaches zero) the FCS will become a lower the complexity score.

Figure 3:
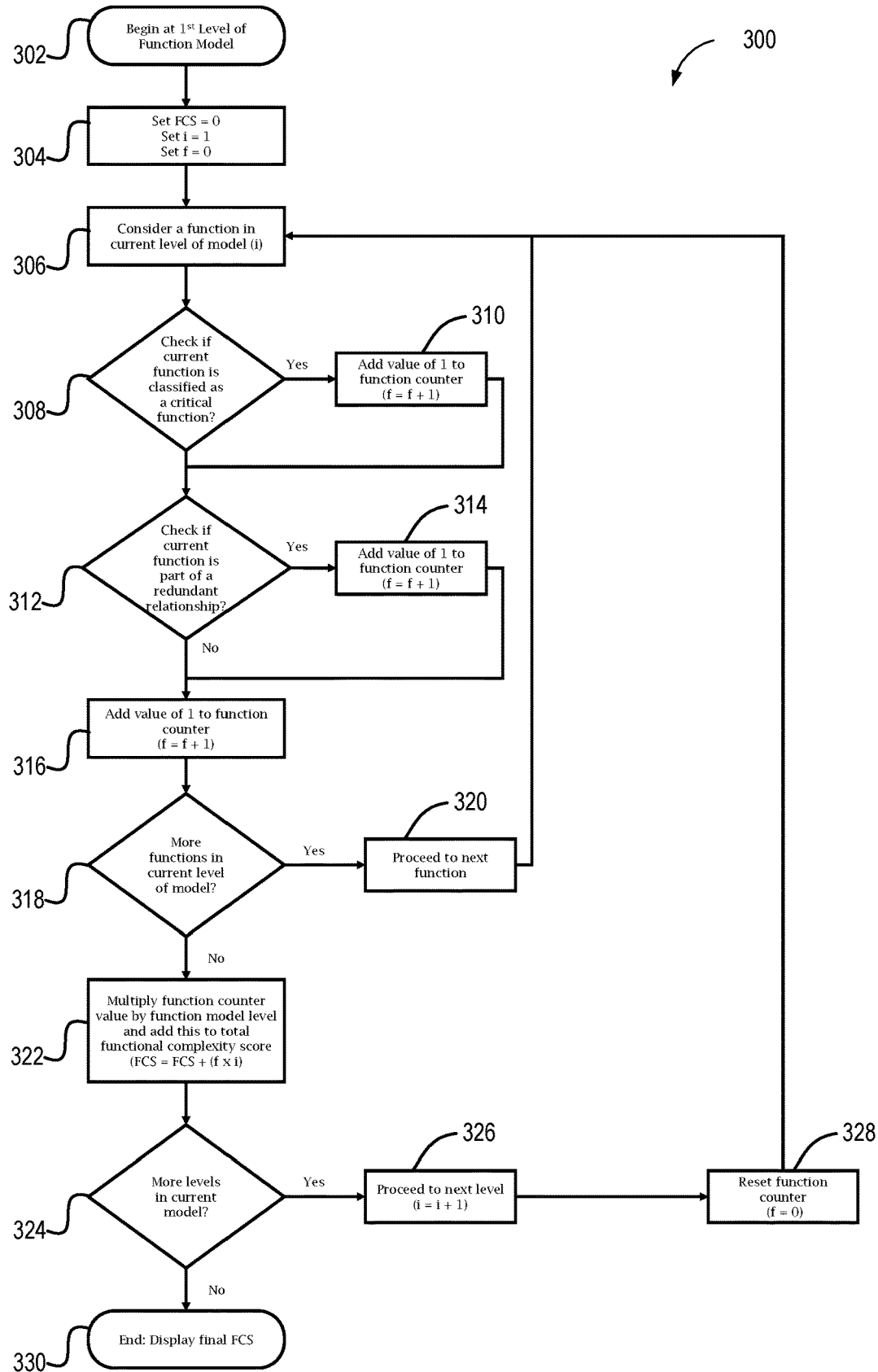
FIG. 3 illustrates a flow chart of a method for determining a functional complexity score (FCS) in accordance with one embodiment.

FIG. 3 illustrates a flow chart of a method 300 for determining an FCS. The method 300 is an implementation of Equation 1. The method 300 may be performed by a modeling system (e.g., modeling system 800 shown in FIG. 8). As seen in FIG. 3, the calculation of the FCS for a given function model is done by looping through each level of the function model and counting the number of functions, the number of redundant relationships, and the number of critical functions. The FCS may be tabulated according to Equation 1 using counters that are reset when appropriate.

The method 300 may begin 302 at the first level of the function model. The levels of the function model refer to the position of the functions int the hierarchal structure (e.g., first level is the beginning of the function model's tree-like structure). The method 300 may set 304 several variables to initial values. For example, the method 300 may set 304 FCS to zero, a level counter (i.e., variable i representing the current level) to one, and a function counter (i.e., variable f representing the number of functions in the level) to zero.

The method may loop through each function of the current level. The method 300 considers 306 a function in the current level of the model (i). Considering a function may include detecting a function in the level that has not been previously detected. The method 300 may check 308 if the current function under consideration is classified as a critical function. If the function is a critical function, the method 300 adds 310 a value of one to the function counter (e.g., f=f+1). If the function is not a critical function no value is added to the function counter. The method 300 may check 312 if the current function is part of a redundant relationship. If the function is redundant, the method 300 may add 314 a value of one to the function counter (e.g., f=f+1). The method may also add 316 a value of one to the function counter (e.g., f=f+1) when considering the function. Thus, the function counter increases with each function in the level by one. The method 300 checks 318 to see if there are more functions in the current level of the model not considered. If there are more functions in the level, the method 320 proceeds 320 to the next function.

If there are not more functions in the current level of the model, the method 300 may determine an amount to add to the FCS score based on the function counter and the level counter. For example, the method 300 may multiply 322 the function counter value by the function model level and add the result to a total functional complexity score, where the total functional complexity score includes the complexity score from the current level and the complexity score from previous levels (e.g., FCS=FCS+(f×i).

The method 300 may loop through each level and consider each function for each level. For example, the method 300 may check 324 if there are more levels in a current model. If there is another level, the method may proceed 326 to the next level and increase the value of the level counter by a value of one (e.g., i=i+1). For each new level the method 300 may reset 328 the function counter to zero (e.g., f=0). The method 300 may then consider 306 the functions of the new level and determine an additional amount to be added to the total FCS for the level as discussed above.

Figure 5:
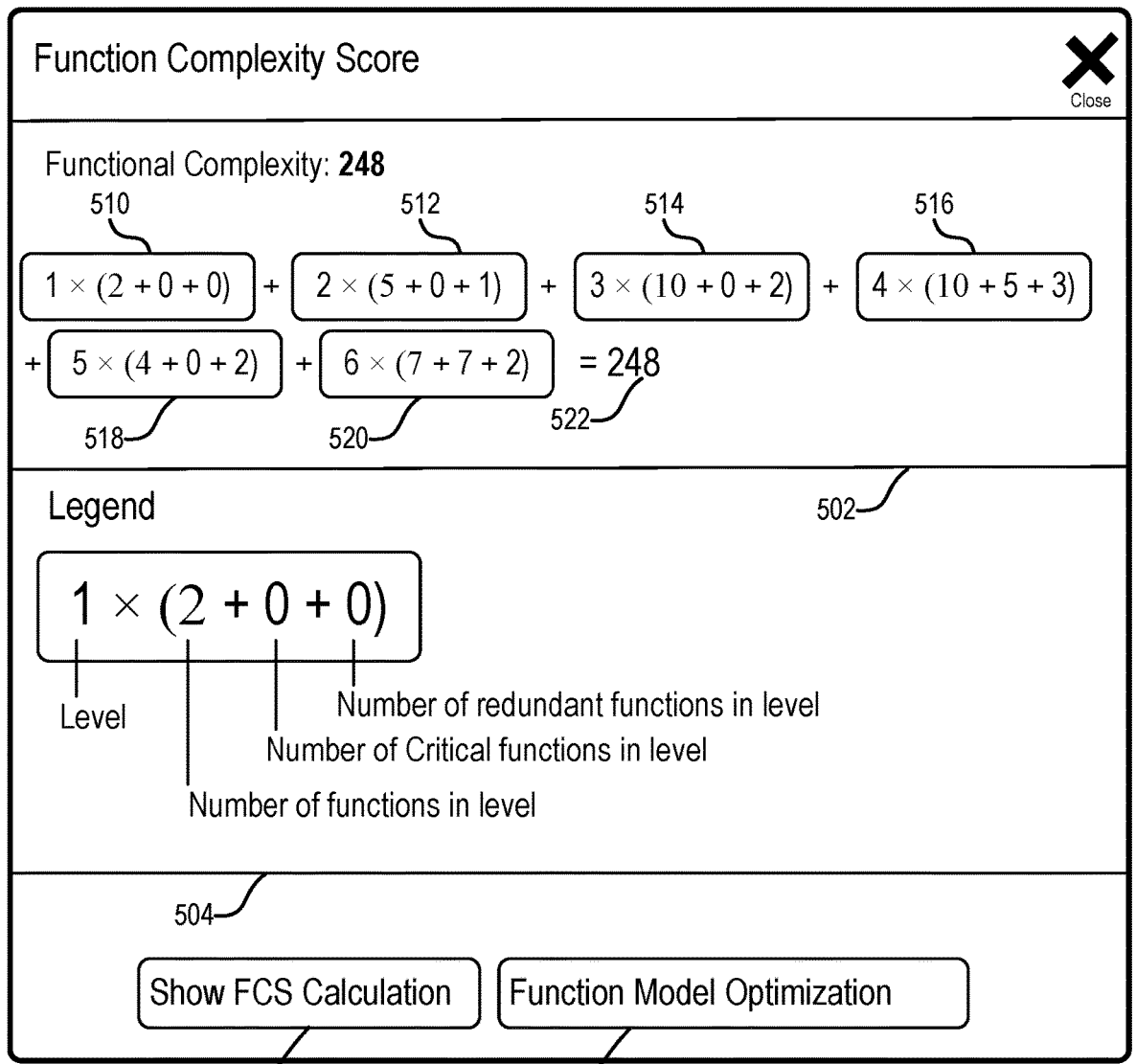
FIG. 5 illustrates a graphical user interface (GUI) comprising a detailed FCS calculation for the example function model of FIG. 4 in accordance with one embodiment.
Figure 7:
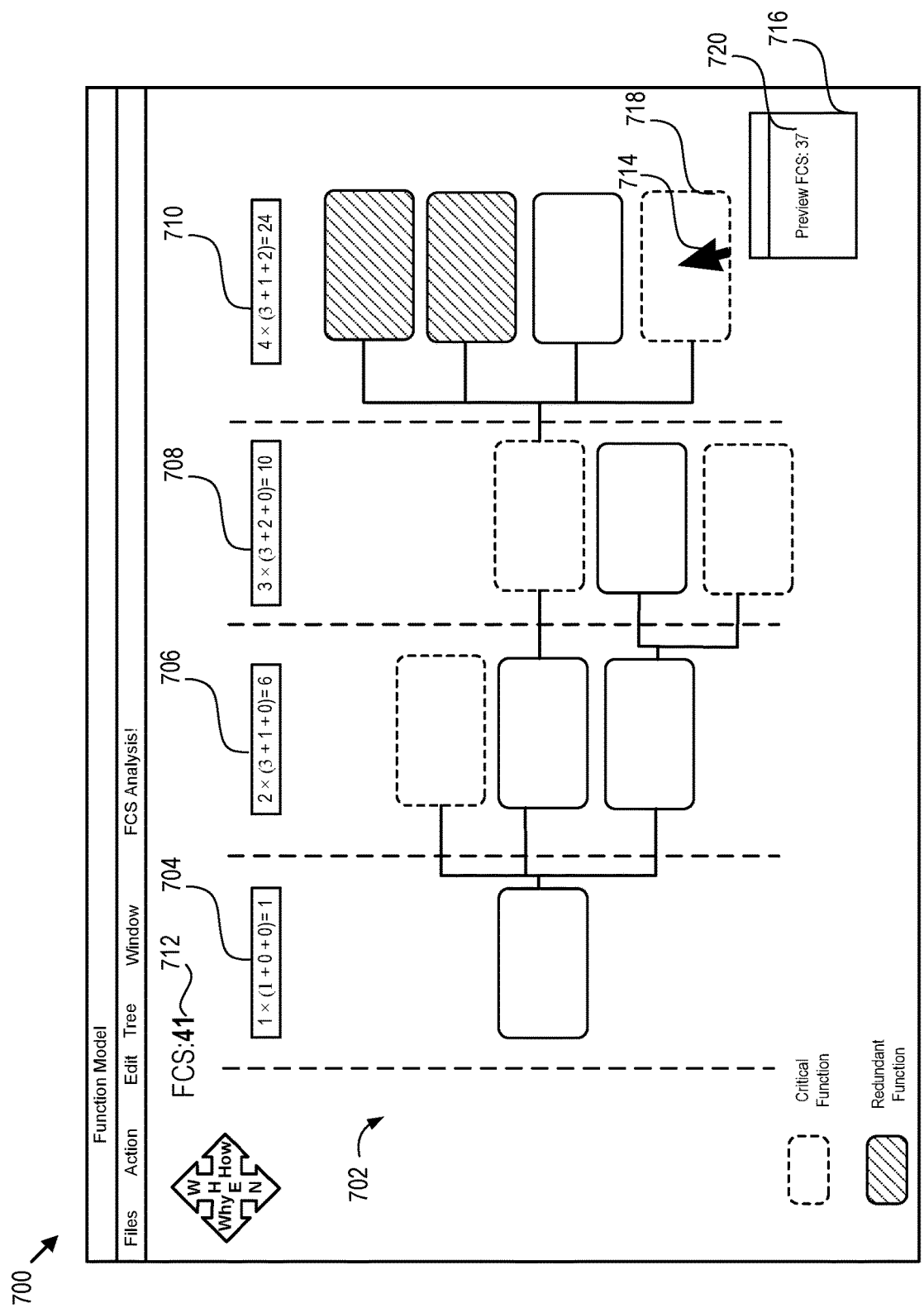
FIG. 7 illustrates a GUI for optimizing a function model using an FCS, according to one embodiment.

When there are no more levels in the current model, the method 330 may display 330 the final FCS on a graphical user interface (GUI) (e.g., GUI 500 of FIG. 5 and GUI 700 of FIG. 7).

Embodiments contemplated herein include an apparatus comprising means to perform one or more elements of the method 300. Embodiments contemplated herein include one or more non-transitory computer-readable media comprising instructions to cause an electronic device, upon execution of the instructions by one or more processors of the electronic device, to perform one or more elements of the method 300. Embodiments contemplated herein include an apparatus comprising logic, modules, or circuitry to perform one or more elements of the method 300. Embodiments contemplated herein include an apparatus comprising: one or more processors and one or more computer-readable media comprising instructions that, when executed by the one or more processors, cause the one or more processors to perform one or more elements of the method 300. Embodiments contemplated herein include a computer program or computer program product comprising instructions, wherein execution of the program by a processor is to cause the processor to carry out one or more elements of the method 300.

Figure 4:
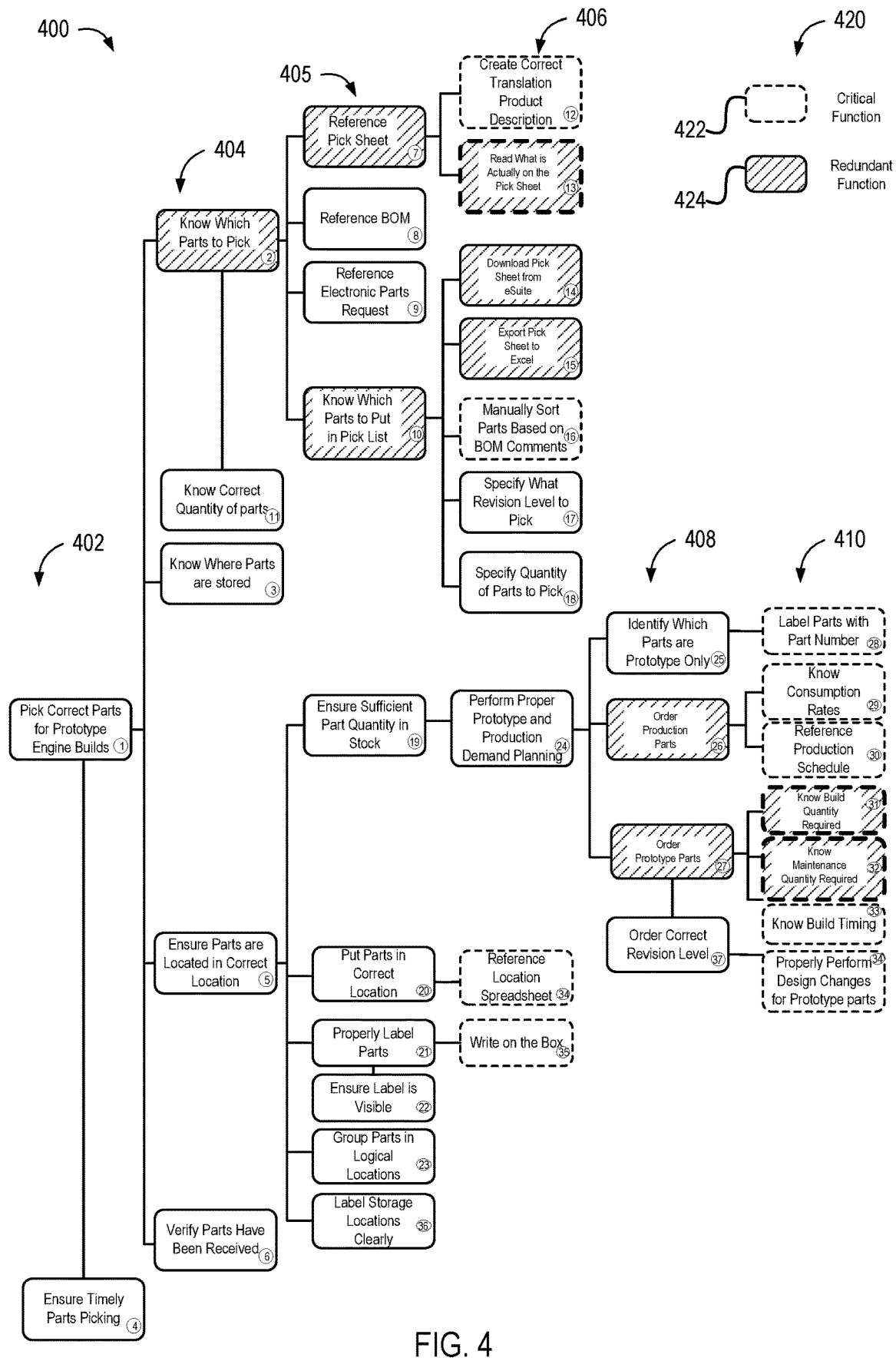
FIG. 4 illustrates an example function model in accordance with one embodiment.

FIGS. 4 and 5 provide an example of how a modeling system may calculate an FCS using Equation 1. The calculation may be performed using method 300 of FIG. 3. More specifically, FIG. 4 illustrates an example function model 400, and FIG. 5 illustrates a GUI 500 comprising a detailed FCS calculation for the example function model 400 of FIG. 4.

The example function model 400 of FIG. 4 comprises a plurality of functions grouped into several hierarchal levels (e.g., first level 402, second level 404, third level 405, fourth level 406, fifth level 408, and sixth level 410). The key 420 indicates that element blocks with dashed lines around the perimeter represent critical functions 422, and element blocks with diagonal fill lines represent redundant functions 424. Some functions may be both redundant and critical functions. In other embodiments, the critical functions 422 may be sub-divided into different types of critical functions as shown in FIG. 2. For simplicity however, FIG. 4 shows all critical functions with the same dashed perimeter.

The GUI 500 of FIG. 5 may include an FCS calculation portion 502 and a legend portion 504. The FCS calculation portion 502 comprises an FCS calculation that includes a total complexity score 522, and a set of level complexities (e.g., first complexity score 510, second complexity score 512, third complexity score 514, fourth complexity score 516, fifth complexity score 518, sixth complexity score 520). The set of level complexities includes values corresponding to each hierarchal levels (e.g., first level 402, second level 404, third level 405, fourth level 406, fifth level 408, and sixth level 410) of the function model 400.

The legend portion 504 provides a list of definitions for the variables in the FCS equation. In the illustrated embodiment, for each level complexity computation the first variable is the level, the second variable is the number of functions in the level, the third variable is the number of critical functions in the level, and the fourth variable is the number of redundant functions in the level.

The level complexity computations in the FCS calculation portion 502 correspond to the levels of the function model 400. For example, in the first level 402 there are two functions and neither function is critical or redundant. Accordingly, the first complexity score 510 is 1×(2+0+0). Similarly, for the second level 404, the corresponding second complexity score 512 includes the level value (i.e., 2), the number of functions in the level (i.e., 5), the number of critical functions in the level (i.e., 0), and the number of redundant functions in the level (i.e., 1). For the third level 405, the corresponding third complexity score 514 includes the level value (i.e., 3), the number of functions in the level (i.e., 10), the number of critical functions in the level (i.e., 0), and the number of redundant functions in the level (i.e., 2). For the fourth level 406, the corresponding fourth complexity score 516 includes the level value (i.e., 4), the number of functions in the level (i.e., 10), the number of critical functions in the level (i.e., 5), and the number of redundant functions in the level (i.e., 3). Note that for the fourth complexity score 516 that one of the functions is counted as both redundant and critical. For the fifth level 408, the corresponding fifth complexity score 518 includes the level value (i.e., 5), the number of functions in the level (i.e., 4), the number of critical functions in the level (i.e., 0), and the number of redundant functions in the level (i.e., 2). For the sixth level 410, the corresponding sixth complexity score 520 includes the level value (i.e., 6), the number of functions in the level (i.e., 7), the number of critical functions in the level (i.e., 7), and the number of redundant functions in the level (i.e., 2). Note that the sixth level 410 includes two functions that are both redundant and critical. The total complexity score 522 for the example function model 400 is 248 according to the illustrated embodiment.

In this embodiment, functions that are both critical (e.g., a failure) and redundant are counted both as a critical and a redundant function. In other embodiments if a function is both a critical and redundant, the modeling system may count such a function as a single critical function.

Also, in the embodiments described with reference to FIGS. 3-5, each critical function adds the same value to the FCS (i.e., 1). In other embodiments, a modeling system may weight the critical function term in Equation 1 based on the type of critical function. Several different critical function types are shown in FIG. 2. For example, the modeling system may weight a failed function higher than potential failures. In some embodiments, failures may be rated higher than redundancies.

In some embodiments, the GUI 500 may be implemented as a window that is brought up when a user selects an input. In some embodiments, the GUI 500 may be present as the user is building the function model 400 in a modeling software suite. For instance, in some embodiments, a modeling system may implement an on-the-fly calculation that is displayed to the user as the function model is being created.

The GUI 500 may also include a show FCS calculation button 530 and an optimization button 532. When a user selects the optimization button 532 the user may be presented with a table which summarizes the potential reduction of the FCS if a given function is improved. Improvement of the function may come in the form of the elimination of failures or the removal of redundancy or conflicts. When a user selects the show FCS calculation button 530, the user may be be shown the FCS calculation.

Figure 6:
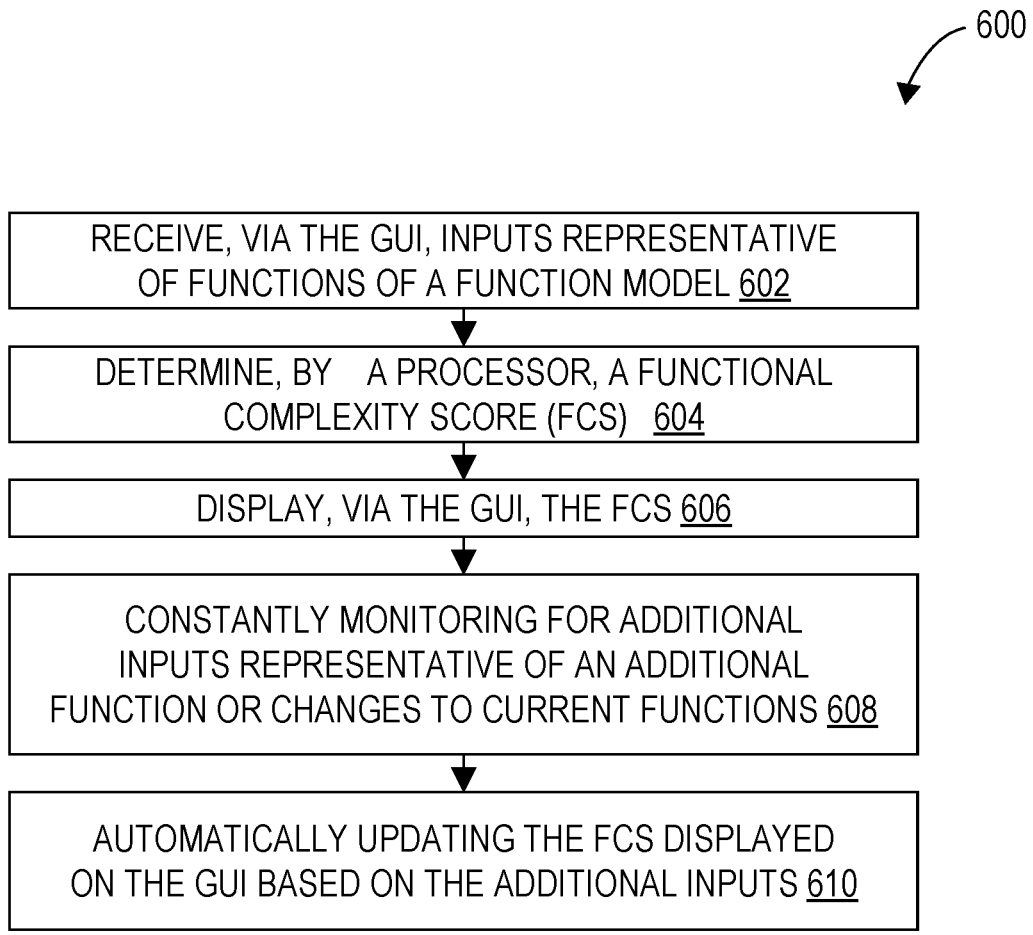
FIG. 6 illustrates a method for generating a function model and FCS on a GUI.

FIG. 6 illustrates a method 600 for generating a function model and FCS on a GUI. The method 600 may be performed by a modeling system (e.g., modeling system 800 shown in FIG. 8).

A system performing the method 600 may receive 602, via a GUI, inputs representative of functions of a function model. The system may determine 604, by a processor, an FCS by looping through each level of the function model and determining a score based on both hierarchical relationships and functional relationships within the function model at each level. For example, the system may use Equation 1 and method 300 of FIG. 3 to determine the FCS.

The system may display 606, via the GUI, the FCS. The system may also constantly monitor 608 for additional inputs representative of an additional function or changes to current functions, and automatically update 610 the FCS displayed on the GUI based on the additional inputs.

In some embodiments, the method 600 may further comprise further comprise determining a location of a cursor within the GUI relative to the functions of the function model. The method 600 may further automatically determine, via the processor, a preview FCS when a cursor hovers over a critical function or a redundant function, the preview FCS corresponding to a complexity score of the function model in a scenario where the critical function or the redundant function is eliminated, and automatically display, via the GUI, a notification comprising the preview FCS.

In some embodiments, the method 600 may further comprise displaying, via the GUI, the level complexities, and automatically aligning each of the level complexities with an associated level of the function model on the GUI.

In some embodiments, the method 600 may further comprise determining a percentage improvement after updating the FCS and displaying the percentage improvement.

Embodiments contemplated herein include an apparatus comprising means to perform one or more elements of the method 600. Embodiments contemplated herein include one or more non-transitory computer-readable media comprising instructions to cause an electronic device, upon execution of the instructions by one or more processors of the electronic device, to perform one or more elements of the method 600. Embodiments contemplated herein include an apparatus comprising logic, modules, or circuitry to perform one or more elements of the method 600. Embodiments contemplated herein include an apparatus comprising: one or more processors and one or more computer-readable media comprising instructions that, when executed by the one or more processors, cause the one or more processors to perform one or more elements of the method 600. Embodiments contemplated herein include a computer program or computer program product comprising instructions, wherein execution of the program by a processor is to cause the processor to carry out one or more elements of the method 600.

FIG. 7 illustrates a GUI 700 for optimizing a function model 702 using an FCS 712. The GUI may be generated by a modeling system such as modeling system 800 shown in FIG. 8. A system generating the GUI may determine the FCS 712 based on both hierarchical relationships and functional relationships within the function model as described previously. In the illustrated example, the FCS 712 is equal to 41. The FCS 712 may be updated in real time as changes are made to the functions or new functions are added.

The GUI may receive inputs representative of functions. A modeling system may use the inputs to generate the function model 702. As shown, the function model 702 may comprise a series of functions (e.g., function 718). The functions may be organized into hierarchal levels.

The GUI may provide feedback to the user of various changes that may be made to the function model 702 to reduce complexity. For instance, displaying the FCS 712 along with the function model 702 may provide a current complexity of the function model 702. The current complexity may be compared to FCSs associated with other versions of the function model 702 to determine an optimized model. Reducing the complexity of the function model 702 may lead to improved efficiencies of a product or process modeled by the function model 702.

In some embodiments, the modeling system may determine a location of a cursor 714 within the GUI 700 relative to the functions of the function model. The modeling system may automatically determine a preview FCS 720 when the cursor hovers over a critical function or a redundant function (e.g., critical function 718). The preview FCS 720 corresponds to a complexity score of the function model in a scenario where the critical function or the redundant function is eliminated. In the illustrated embodiment, the cursor 714 is hovering over critical function 718, and the GUI 700 displays, a notification 716 comprising the preview FCS 720 near the critical function 716. This preview FCS 720 may provide an indication of how changes to the function model 702 may affect the complexity.

In the illustrated embodiment, the GUI also displays level complexities 704-710. The level complexities provide a score for each hierarchal level of the function model 702. The level complexities summed together equal the FCS 712. The GUI may automatically align each of the level complexities with an associated level of the function model on the GUI. The level complexities may allow a user to more easily see where improvements may be made to the function model 702. For instance, in the illustrated embodiment, a fourth level has a level complexity 710 much higher than the other levels. The higher value may direct a user to make improvements within the fourth level.

Figure 8:
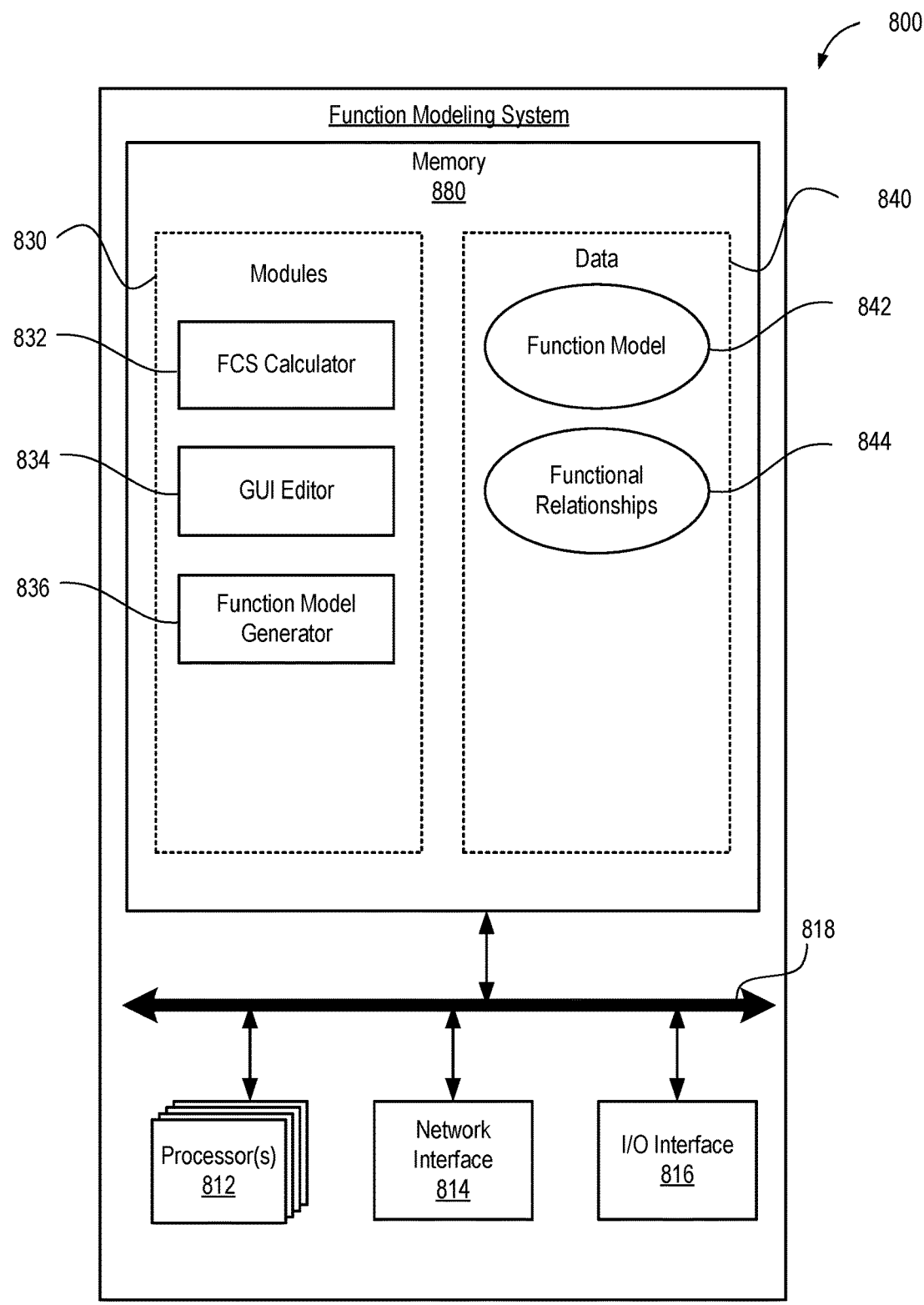
FIG. 8 is a block diagram illustrating a function modeling system, according to one embodiment.

FIG. 8 is a block diagram illustrating a function modeling system 800, according to one embodiment. The function modeling system 800 includes a memory 810, one or more processors 812, a network interface 814, and an input/output (I/O) interface 816.

The processor 812 may be used to process executable code and data stored in the memory 810. The memory 810 may include static RAM, dynamic RAM, flash memory, one or more flip-flops, or other electronic storage medium. The electronic memory 810 may include a plurality of modules 830 and data 840. The modules 830 may run multiple operations serially, concurrently or in parallel on the one or more processors 812.

In some embodiments, portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. A software module or component may include any type of computer instruction or computer executable code located within or on a computer-readable storage medium. A software module may, for instance, comprise one or more physical or logical blocks of computer instructions, which may be organized as a routine, program, object, component, data structure, etc., that performs one or more tasks or implement particular abstract data types. A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media.

In one embodiment, the modules 830 include an FCS calculator 832, a GUI editor 834, and a function model generator 136. The FCS calculator 832 may determine the FCS as described with reference to the previous figures. The GUI editor 834 may generate and update a GUI. The GUI may be the GUI of FIG. 7 or FIG. 5. The function model generator 136 may generate a function model 142 for display on the GUI.

The data 840 stored on the memory 810 may include the data 840 receive or generated by the function modeling system 800, such as by the modules 830 or other modules. The data 840 stored may be organized as one or more memory registers/addresses, files, and/or databases. The data 840 may include a function model 842, and functional relationships 844.

The network interface 814 may facilitate communication with other computing devices and/or networks, such as the Internet and/or other computing and/or communications networks. The network interface 814 may be equipped with conventional network connectivity. The network interface 814 may be a wireless network interface, equipped with conventional wireless network connectivity technologies.

The I/O interface 816 may facilitate interfacing with the function modeling system 800. For example, the I/O interface 816 may provide a report indicating the FCS and suggestions to improve the FCS.

A system bus 818 may facilitate communication and/or interaction between the other components of the function modeling system 800, including the memory 810, the one or more processors 812, the network interface 814, and the I/O interface 816.

As can be appreciated, in other embodiments, the function modeling system 800 may be simpler than shown or described. For example, certain designs may forgo one or more components, such as memory, multiple processors, multiple interfaces, and the like, and instead execute instructions closer to or on bare metal (e.g., without intervening operating system or other software layer, executing instructions directly on logic hardware).

Figure 9:
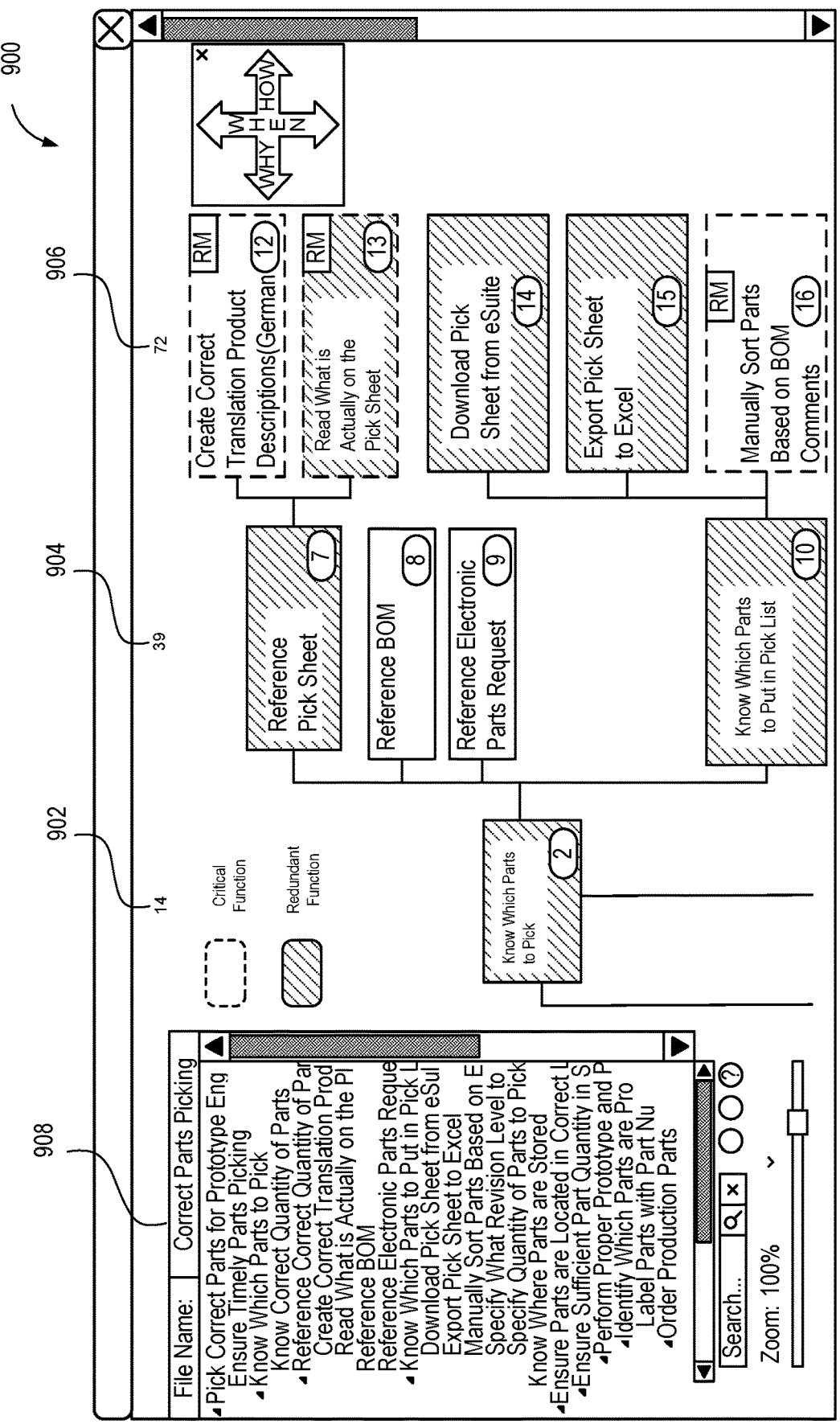
FIG. 9 illustrates a GUI for displaying a function model.

FIG. 9 illustrates a GUI 900 for displaying a function model according to one embodiment. The GUI 9 may display level complexities 902-906. The level complexities provide a score for each hierarchal level of the function model. The functions of the model may be designated as critical or redundant. Additionally, the GUI 900 may include a listing of the functions.

Figure 10:
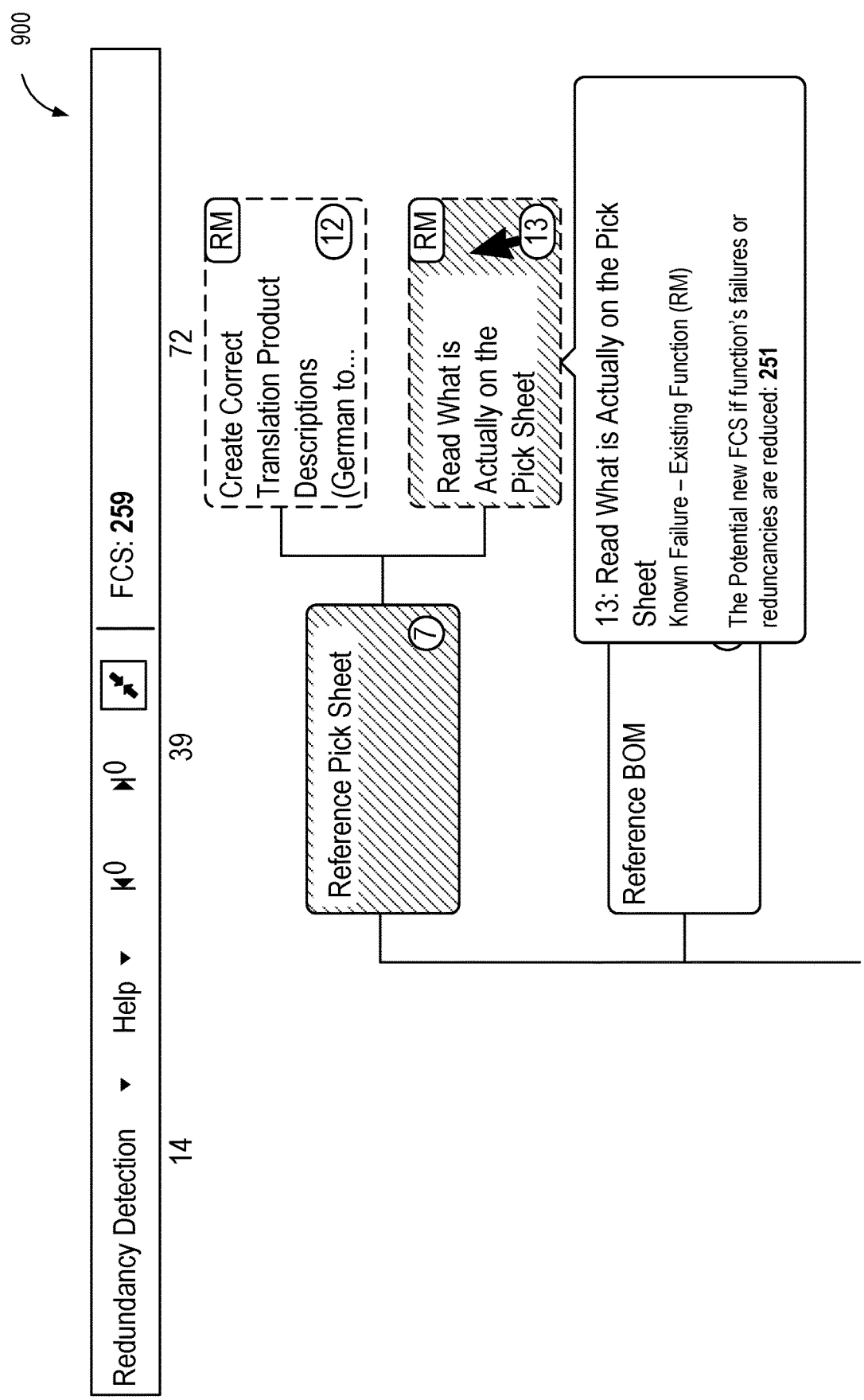
FIG. 10 illustrates a GUI for interacting with a function model.

FIG. 10 illustrates a portion of the GUI 900 shown in FIG. 9 and demonstrates a way user may interact with a function model. As shown, when a user hovers a cursor over a function, the GUI 900 may display additional information. The additional information may include a potential change to the overall FCS score if the function's failures or redundancies are reduced.

Embodiments and implementations of systems and methods described herein may include various steps, which may be embodied in machine-executable instructions to be executed by a computer system. A computer system may include one or more general-purpose or special-purpose computers (or other electronic devices). The computer system may include hardware components that include specific logic for performing the steps or may include a combination of hardware, software, and/or firmware.

Aspects of certain embodiments may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc., that performs one or more tasks or implement particular abstract data types. A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media.

Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network. According to one embodiment, a database management system (DBMS) allows users to interact with one or more databases and provides access to the data contained in the databases.

Embodiments may be provided as a computer program product including a computer-readable medium having stored thereon instructions that may be used to program a computer system or other electronic device to perform the processes described herein. The computer-readable medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of media/computer-readable media suitable for storing electronic instructions.

Although the foregoing has been described in some detail for purposes of clarity, it will be apparent that certain changes and modifications may be made without departing from the principles thereof. It should be noted that there are many alternative ways of implementing the processes, apparatuses, and system described herein. Accordingly, the present embodiments are to be considered illustrative and not restrictive, and the invention is not to be limited to the details given herein, but may be modified within the scope and equivalents of the appended claims.

As used herein, the terms "comprises," "comprising," and any other variation thereof are intended to cover a non-exclusive inclusion, such that a process, a method, an article, or an apparatus that comprises a list of elements does not include only those elements but may include other elements not expressly listed or inherent to such process, method, system, article, or apparatus.

It will be apparent to those having skill in the art that many changes may be made to the details of the above-described embodiments without departing from the underlying principles of the invention. The scope of the present invention should, therefore, be determined only by the following claims.

What is claimed is:

1. A method for generating a function model and a functional complexity score (FCS) on a graphical user interface (GUI), the method comprising
    receiving, via the GUI, inputs representative of functions of a function model;
    determining, by a processor, the FCS by:
        counting a number of functions in each level, $F_i$, a number of redundant functions in each level, $R_i$, and a number of critical functions in each level, $C_i$;
        determining level complexities for each level by multiplying a value of a current level by a sum of $F_i$, $R_i$, and $C_i$ for the current level, and
        adding all the level complexities together;
    displaying, via the GUI, the FCS;
    constantly monitoring for additional inputs representative of an additional function or changes to current functions; and
    automatically updating the FCS displayed on the GUI based on the additional inputs.

2. The method of claim 1, wherein the FCS is based on both hierarchical relationships and functional relationships within the function model.

3. The method of claim 1, further comprising:
determining a location of a cursor within the GUI relative to the functions of the function model;
automatically determining, via the processor, a preview FCS when the cursor hovers over a critical function or a redundant function, the preview FCS corresponding to a complexity score of the function model in a scenario where the critical function or the redundant function is eliminated; and
automatically displaying, via the GUI, a notification comprising the preview FCS.

4. The method of claim 1, further comprising:
displaying, via the GUI, the level complexities; and
automatically aligning each of the level complexities with an associated level of the function model on the GUI.

5. The method of claim 1, further comprising determining a percentage improvement after updating the FCS and displaying the percentage improvement.

6. The method of claim 1, wherein determining the FCS further comprises weighting critical functions based on a type of failure associated with the critical functions.

7. The method of claim 6, wherein the type of failure comprises a known failure, a potential failure, a potential human input error, or a non-existing function.

8. A non-transitory computer-readable storage medium, the computer-readable storage medium including instructions that when executed by a computer, cause the computer to:
receive, via a graphical user interface (GUI), inputs representative of functions of a function model;
determine, by a processor, a functional complexity score (FCS) by:
counting a number of functions in each level, $F_i$, a number of redundant functions in each level, $R_i$, and a number of critical functions in each level, $C_i$;
determining level complexities for each level by multiplying a value of a current level by a sum of $F_i$, $R_i$, and $C_i$ for the current level, and
adding all the level complexities together;
display, via the GUI, the FCS;
constantly monitor for additional inputs representative of an additional function or changes to current functions; and
automatically update the FCS displayed on the GUI based on the additional inputs.

9. The computer-readable storage medium of claim 8, wherein the FCS is based on both hierarchical relationships and functional relationships within the function model.

10. The computer-readable storage medium of claim 8, wherein the instructions further configure the computer to:
determine a location of a cursor within the GUI relative to the functions of the function model;
automatically determine, via the processor, a preview FCS when the cursor hovers over a critical function or a redundant function, the preview FCS corresponding to a complexity score of the function model in a scenario where the critical function or the redundant function is eliminated; and
automatically display, via the GUI, a notification comprising the preview FCS.

11. The computer-readable storage medium of claim 8, wherein the instructions further configure the computer to:
display, via the GUI, the level complexities; and
automatically align each of the level complexities with an associated level of the function model on the GUI.

12. The computer-readable storage medium of claim 8, wherein the instructions further configure the computer to determine a percentage improvement after updating the FCS and display the percentage improvement.

13. The computer-readable storage medium of claim 8, wherein determining the FCS further comprises weight critical functions based on a type of failure associated with the critical functions.

14. The computer-readable storage medium of claim 13, wherein the type of failure comprises a known failure, a potential failure, a potential human input error, or a non-existing function.

15. A computing apparatus comprising:
a processor; and
a memory storing instructions that, when executed by the processor, configure the apparatus to:
receive, via the a graphical user interface (GUI), inputs representative of functions of a function model;
determine, by a processor, a functional complexity score (FCS)
counting a number of functions in each level, $F_i$, a number of redundant functions in each level, $R_i$, and a number of critical functions in each level, $C_i$;
determining level complexities for each level by multiplying a value of a current level by a sum of $F_i$, $R_i$, and $C_i$ for the current level, and
adding all the level complexities together;
display, via the GUI, the FCS;
constantly monitor for additional inputs representative of an additional function or changes to current functions; and
automatically update the FCS displayed on the GUI based on the additional inputs.

16. The computing apparatus of claim 15, wherein the FCS is based on both hierarchical relationships and functional relationships within the function model.

17. The computing apparatus of claim 15, wherein the instructions further configure the apparatus to:
determine a location of a cursor within the GUI relative to the functions of the function model;
automatically determine, via the processor, a preview FCS when the cursor hovers over a critical function or a redundant function, the preview FCS corresponding to a complexity score of the function model in a scenario where the critical function or the redundant function is eliminated; and
automatically display, via the GUI, a notification comprising the preview FCS.

18. The computing apparatus of claim 15, wherein the instructions further configure the apparatus to:
display, via the GUI, the level complexities; and
automatically align each of the level complexities with an associated level of the function model on the GUI.

19. The computing apparatus of claim 15, wherein the instructions further configure the apparatus to determine a percentage improvement after updating the FCS and display the percentage improvement.

20. The computing apparatus of claim 15, wherein determining the FCS further comprises weight critical functions based on a type of failure associated with the critical functions.

* * * * *